US006274479B1

(12) United States Patent
Srinivasan (10) Patent No.: US 6,274,479 B1
(45) Date of Patent: Aug. 14, 2001

(54) FLOWABLE GERMANIUM DOPED SILICATE GLASS FOR USE AS A SPACER OXIDE

(75) Inventor: Anand Srinivasan, Boise, ID (US)

(73) Assignee: Micron Technology, INC, Boise, ID (US)

( * ) Notice: Subject to any disclaimer, the term of this patent is extended or adjusted under 35 U.S.C. 154(b) by 0 days.

(21) Appl. No.: 09/137,736

(22) Filed: Aug. 21, 1998

(51) Int. Cl.$^7$ ................................................ H01L 21/4763
(52) U.S. Cl. ........................ 438/632; 438/633; 438/634; 438/648
(58) Field of Search ..................... 438/632, 633, 438/634, 648, 696, 908, 688, 635, 636, 637, 638, 640, 312, 313, 315; 257/316, 317, 320, 322, 324

(56) References Cited

U.S. PATENT DOCUMENTS

| | | | |
|---|---|---|---|
| 3,887,733 | * 6/1975 | Tolliver et al. | 427/444 |
| 4,630,343 | * 12/1986 | Pierce et al. | 29/576 |
| 4,837,173 | * 6/1989 | Alvis et al. | 437/24 |
| 4,951,100 | * 8/1990 | Parrillo | 357/233 |
| 5,013,675 | * 5/1991 | Shen et al. | 437/44 |
| 5,063,172 | * 11/1991 | Manley | 437/43 |
| 5,310,456 | * 5/1994 | Kodomura | 156/657 |
| 5,340,769 | * 8/1994 | Miyamoto | 437/67 |
| 5,408,115 | * 4/1995 | Chang | 257/324 |
| 5,422,504 | * 6/1995 | Chang et al. | 257/316 |
| 5,455,205 | * 10/1995 | Umimoto et al. | 437/240 |
| 5,467,308 | * 11/1995 | Chang et al. | 365/185 |
| 5,584,964 | * 12/1996 | Umimoto et al. | 156/657 |
| 5,824,584 | * 10/1998 | Chen et al. | 438/267 |
| 5,960,315 | * 9/1999 | Gambino et al. | 438/632 |
| 6,137,149 | * 10/2000 | Kodama | 257/408 |

FOREIGN PATENT DOCUMENTS

| | | | | |
|---|---|---|---|---|
| 40-1256-15 | * | 4/1988 | (JP) | 21/90 |
| 3-0773-76 | * | 8/1989 | (JP) | 29/78 |
| 40-3069-16 | * | 8/1989 | (JP) | 29/784 |
| 4-3332-37 | * | 11/1992 | (JP) | 18/42 |

OTHER PUBLICATIONS

Peter Van Zant, Microchip Fabrication 3rd Edition, pp. 166 and 374 (1997).*

* cited by examiner

Primary Examiner—Charles Bowers
Assistant Examiner—Laura M Schillinger
(74) Attorney, Agent, or Firm—Hugh R. Kress; Winstead Sechrest & Minick P.C.

(57) ABSTRACT

The invention is a method for constructing an integrated circuit structure and an apparatus produced by the method. The method generally comprises constructing an integrated circuit structure by disposing a layer of doped oxide, the dopant being iso-electronic to silicon, and then reflowing the layer of doped oxide. Thus, the apparatus of the invention is an integrated circuit structure comprising a reflowed layer of doped oxide wherein the dopant is iso-electronic to silicon. In one particular embodiment, the method generally comprises constructing an integrated circuit feature on a substrate; disposing a layer of doped oxide, the dopant being iso-electronic to silicon, over the integrated circuit feature and the substrate in a substantially conformal manner; reflowing the layer of doped oxide; and etching the insulating layer and the oxide. Thus, in this particular embodiment, the apparatus comprises an integrated circuit feature constructed on a substrate and a reflowed layer of doped oxide, the dopant being iso-electronic to silicon, disposed over the integrated circuit feature and the substrate.

38 Claims, 6 Drawing Sheets

```
┌─────────────────────────────────────────────────────┐
│  Construct an integrated circuit feature on a substrate  │
└─────────────────────────────────────────────────────┘
                          │
                          ▼
┌─────────────────────────────────────────────────────┐
│       Dispose a layer of doped oxide, the dopant being   │
│    iso-electronic to silicon, over the integrated circuit │
│             feature in a conformal manner                │
└─────────────────────────────────────────────────────┘
                          │
                          ▼
        ┌──────────────────────────────────────┐
        │    Reflow the layer of doped oxide     │
        └──────────────────────────────────────┘
```

FLOWABLE GERMANIUM DOPED SILICATE GLASS FOR USE AS A SPACER OXIDE

BACKGROUND OF THE INVENTION

1. Field of the Invention

This invention relates to semiconductor manufacturing and, more particularly, to the use of a germanium doped silicate glass as a spacer oxide and as a replacement for Boron-Phosphorous-Silicate-Glass (BPSG) interlevel insulators.

2. Description of the Prior Art

Figure 1:
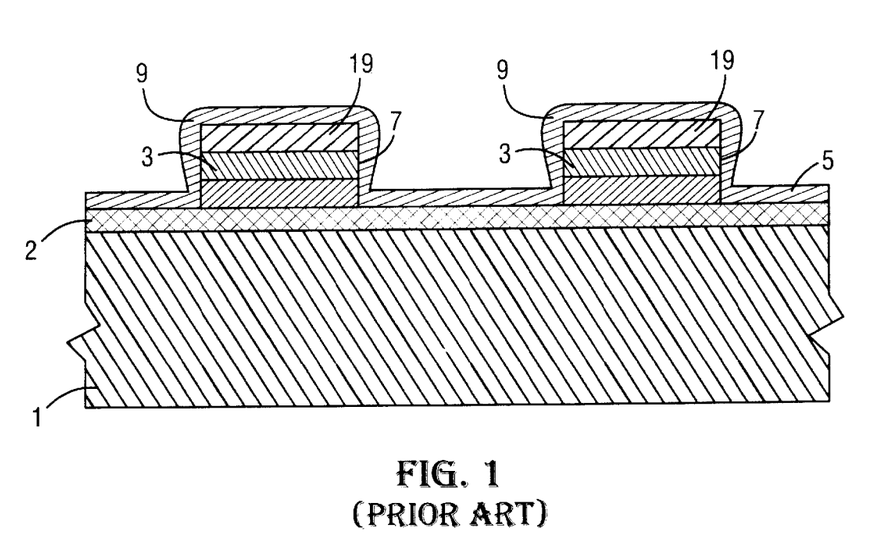
FIG. 1 is a cross-sectional view of an integrated circuit structure illustrating several concepts associated with the present invention in the context of the prior art.

Integrated circuits are typically manufactured by depositing a variety of films on a silicon substrate and then subjecting the films to various processing steps. One typical structure is illustrated in FIG. 1. FIG. 1 depicts two integrated circuit features 3 constructed on a silicon substrate 1, each capped by an insulator 19 and covered by an insulating layer 5 of undoped oxide. An "integrated circuit feature" for present purposes includes all manner of geometric structures that may be disposed on a substrate and includes, but is not limited to, transistor gates, metal lines, interconnects, capacitors, nodes, and leads. The particular features 3 illustrated in FIG. 1 happen to be transistor gates. The gates of FIG. 1 are integrated circuit features created by depositing layers of assorted materials and then etching away portions of the deposited layers. The insulating layer 5 of undoped oxide helps to insulate the features from other conductive materials that might, and probably will, be deposited over the structure of FIG. 1.

The insulating layer 5 of FIG. 1 has "retrograde wall profiles" 7. A retrograde wall profile is a wall profile that is not vertical and generally includes some overhang such that the layer is wider on the top of an integrated circuit feature than it is on the bottom. The particular retrograde wall profiles 7 of the insulating layer 5 in FIG. 1 result from an effect called "breadloafing." Breadloafing is a characteristic of some deposition techniques whereby the deposited insulator is thicker at the tops and corners of the structure and thinner along the sides and is denoted by the numeral 9 in FIG. 1.

Figure 2:
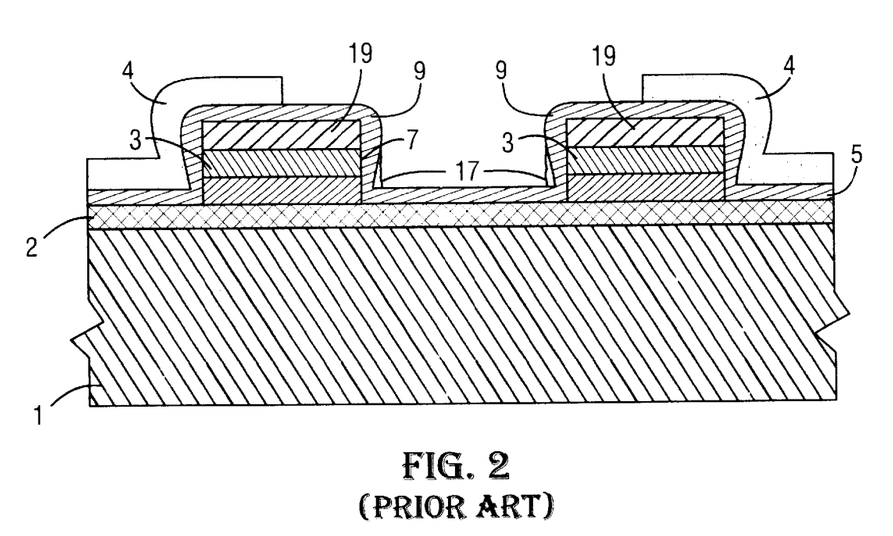
FIG. 2 is a cross-sectional view of another integrated circuit structure illustrating several concepts associated with the present invention in the context of the prior art.

One problem associated with retrograde wall profiles 7 is that materials subsequently deposited in a conformal manner over the retrograde wall will also have retrograde wall profiles. "In a conformal manner" means in a way that mirrors or reflects the topography of the material layer on which the current layer is being deposited. For example, it is common in stacked DRAM capacitors to subsequently deposit a layer of polysilicon 4 over the insulator layer to form the storage node of the capacitor. If the insulating layer is retrograde, and because the polysilicon etch is typically anisotropic, it will be difficult to remove the polysilicon that remains under the overhang portion of the insulating layer. As shown in FIG. 2, the result is an unwanted poly "stringer" 17. If the stringer material is conductive, as in the case of polysilicon 4, it may lead to electrical shorts in the circuitry.

It is known in the art that these problems associated with retrograde wall profiles worsen in proportion with the aspect ratio, i.e., the ratio between the height and width of the integrated circuit features. Features having high aspect ratio, retrograde topologies therefore are very susceptible to stringers. It is therefore desirable to have prograde, or outwardly sloping, wall profiles as opposed to retrograde wall profiles.

Figure 3:
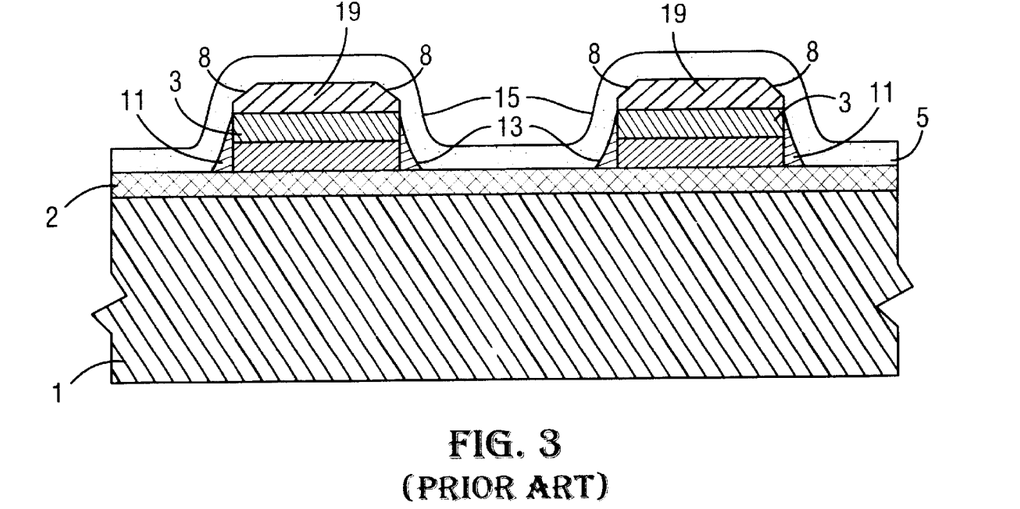
FIG. 3 is a cross-sectional view of a prior art approach known as facet etching.

One approach to obtain effectively prograde wall profiles called "facet etching" is illustrated in FIG. 3. More particularly, after the feature is constructed, a process step etches facets 8 in the top corners of the feature 3 and allows the material 11 etched away to be redeposited in the spaces surrounding the structure. If the etched away material 11 is electrically conductive and of the right composition, it can be oxidized into an insulator. If the etched away material is insulative, as in the case illustrated, this step is unnecessary. The effectively prograde wall profiles 13 generated by this technique produce prograde wall profiles 15 in layers subsequently deposited thereover, as is evident from FIG. 3. There are several variations on this theme and two such techniques are disclosed in U.S. Letters Patent 5,416,048 and 5,346,585. These references are hereby expressly incorporated by reference for all permissible purposes as if set forth verbatim herein.

However, facet etching has several undesirable consequences. Facet etching is an expensive and time consuming process step, and consequently raises overall processing costs. Facet etching also introduces contaminants into the process unless tightly controlled. Thus, it is desirable to find a new technique for obtaining prograde or effectively prograde wall profiles.

SUMMARY OF THE INVENTION

In one aspect of the present invention a method is provided for constructing an integrated circuit structure and an apparatus produced by the method. The method generally comprises constructing an integrated circuit structure by disposing a layer of doped oxide, the dopant being iso-electronic to silicon, and then reflowing the layer of doped oxide. Thus, the apparatus of the invention is an integrated circuit structure comprising a reflowed layer of doped oxide wherein the dopant is iso-electronic to silicon.

BRIEF DESCRIPTION OF THE DRAWINGS

A more particular description of the invention briefly summarized above is set forth below by way of particular embodiments, disclosed in the drawings of this specification and as described in connection therewith. The drawings nevertheless illustrate only typical, particular embodiments of the invention and are not to be considered limiting thereon, as the invetion may be applicable to other equally effective embodiments. In the drawings.

DESCRIPTION OF ILLUSTRATIVE EMBODIMENTS

Numerous specific details are set forth in the detailed description to provide a thorough understanding of the present invention. However, one of ordinary skill in the art, having the benefit of this disclosure, will understand that the present invention may be practiced without many of these details. One of ordinary skill will understand that many such details pertain only to a particular embodiment and that such details will be necessary or useful depending on the particular embodiment being employed. Conversely, in other instances, well known details have not been described in detail for the sake of clarity so as not to obscure the invention. It will be appreciated that supplying such details would be a routine undertaking for those of ordinary skill in the art, even if a complex and time-consuming task, given the benefit of this disclosure.

Figure 4:
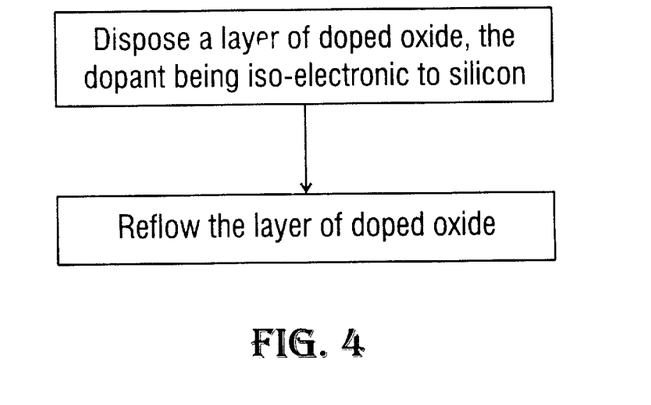
FIG. 4 depicts a cross-section of an incomplete integrated circuit structure partially constructed in accord with the present invention.

One embodiment of the present invention is diagrammed in FIG. 4 and may be generally described as a method for constructing an integrated circuit. An integrated circuit structure 10 constructed in accord with the method of the present invention is shown partially constructed in FIG. 5, more fully constructed in FIG. 6, and completely constructed in FIG. 7 as discussed more fully below.

Figure 5:
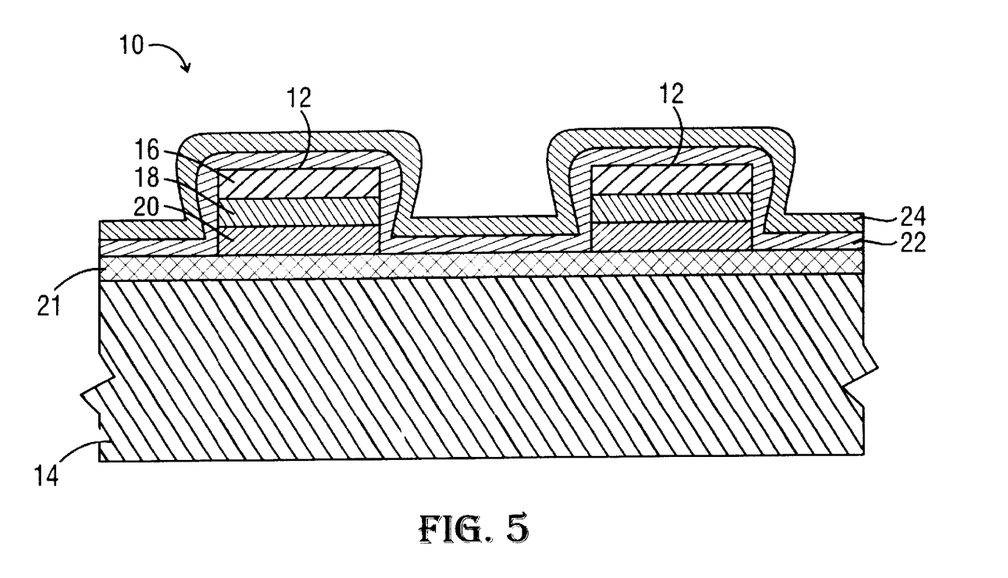
FIG. 5 depicts the cross-section of an integrated circuit structure of FIG. 4 after it is annealed in accord with the present invention.
Figure 6:
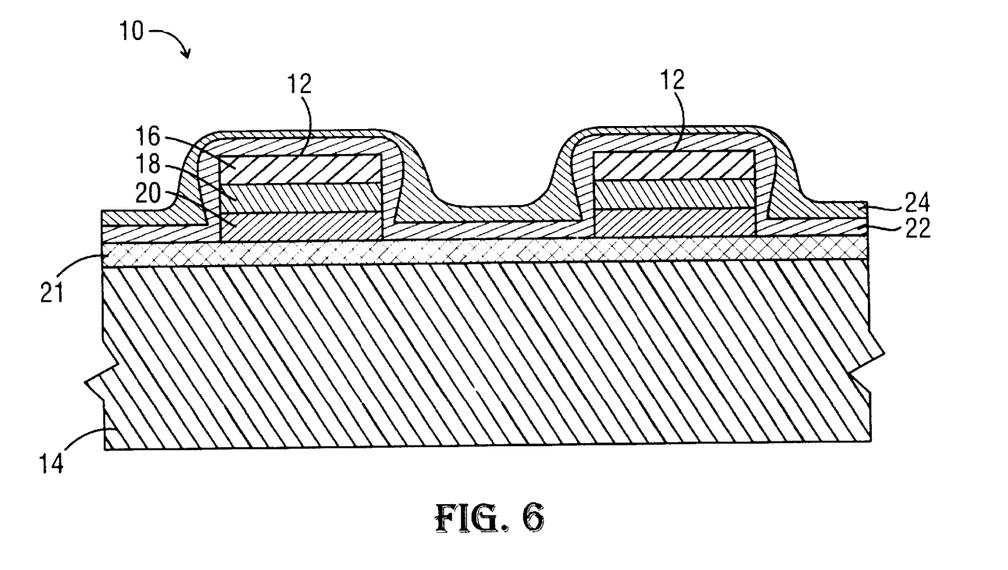
FIG. 6 depicts a cross section of the integrated circuit after it is etched to create an oxide spacer in accord with a particular embodiment of the present invention.
Figure 7:
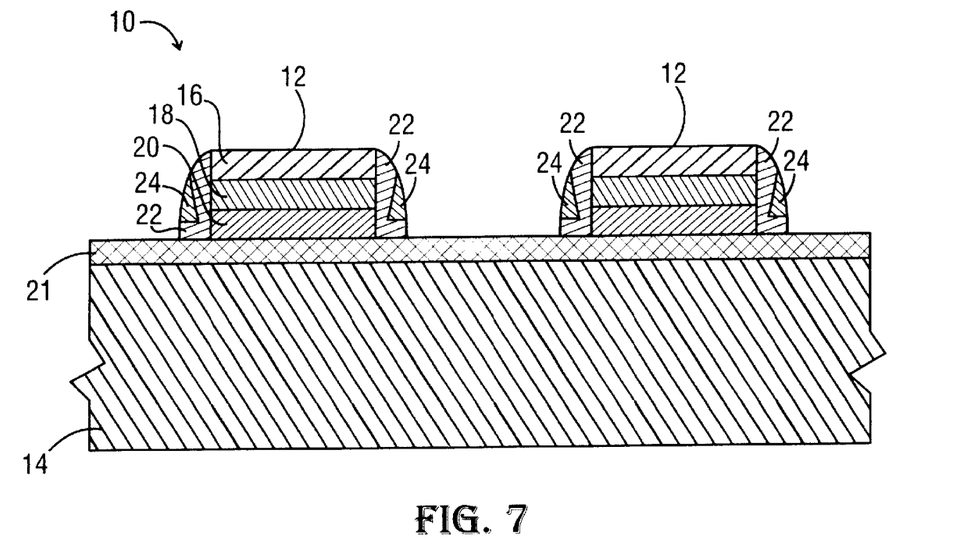
FIG. 7 diagrams a first particular embodiment of the invention in FIG. 3.
Figure 8:
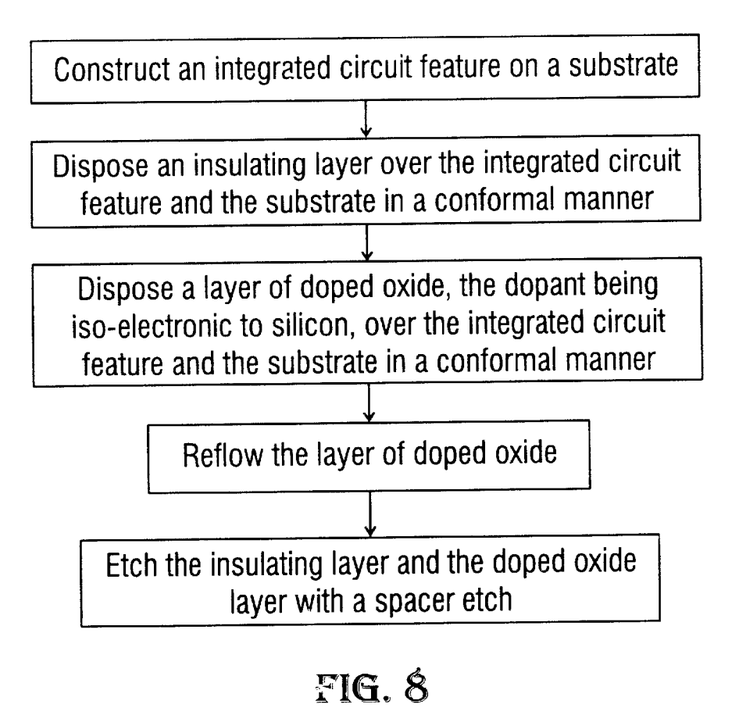
FIGS. 8 and 9 diagram alternative embodiments of the invention in FIG. 4.

FIG. 8 illustrates one particular embodiment of the invention in FIG. 4 used to construct an integrated circuit structure as shown in FIGS. 5–7. More particularly, referring to both FIG. 8 and FIG. 5, at least one integrated circuit feature 12 is first constructed on a substrate 14. The substrate 14 may be of any suitable material known to the art and is preferably a silicon wafer or a previously deposited layer. The integrated circuit feature 12, as illustrated in the particular embodiment of FIGS. 4 and 5, is a gate comprised of an insulating layer 16 disposed over a conductive layer 18, which is disposed over a conductive layer 20, which is disposed over a gate oxide layer 21, which is disposed over the substrate 14. However, the scope of the invention includes all manner of integrated circuit features 12 as defined above, regardless of construction. The type of integrated circuit feature is immaterial to the practice of the invention and the invention is not limited to gates such as are depicted in FIGS. 5–7.

The integrated circuit features 12 may be constructed on the substrate 14 in any suitable manner known to the art. To a large degree, the construction will depend on the type of feature 12, as will by readily recognized by those of ordinary skill in the art having the benefit of this disclosure. For instance, because the integrated circuit feature 12 in the embodiment of FIGS. 4 and 5 is a gate, it is deposited over the gate oxide 21. However, in embodiments where the integrated circuit feature 12 is not a gate, the gate oxide 21 may not be necessary or may be replaced by a field oxide or other suitable substrate. In the particular embodiment of FIGS. 4 and 5, the features 12 are constructed by: (1) depositing the layer of conducting material 20 such as polysilicon on the gate oxide 21; (2) depositing the layer of conducting material 18, such as tungsten silicide ($WSi_x$), over the polysilicon; (3) depositing the layer of insulating material 16, such as an oxide or nitride, over the tungsten silicide; and (4) etching the three layers of material 16, 18, and 20 to obtain the integrated circuit features 12 shown in FIG. 6. The materials and process steps will vary in accord with the type of feature in a manner readily apparent to those of ordinary skill the art.

Figure 9:
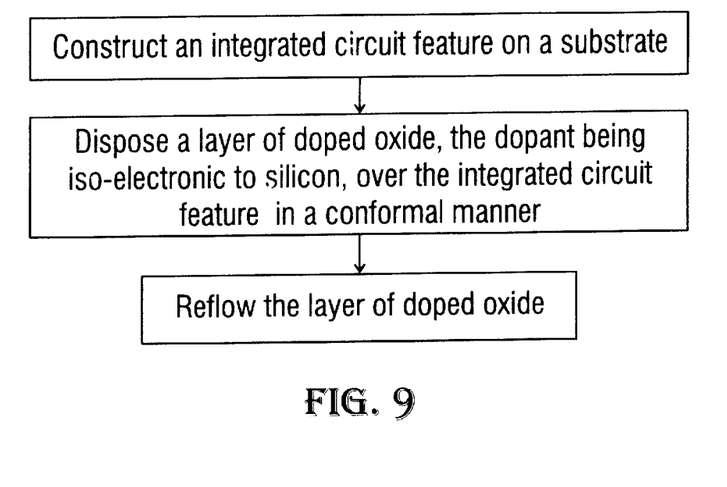

Next, as diagrammed in FIG. 8 and illustrated in FIGS. 5–6, an insulating layer 22 is disposed over the integrated circuit features 12 and the substrate 14 in a generally conformal manner. The type of material may vary according to the particular embodiment and may be any suitable dielectric material known to the art, such as tetraethylorthosilicate ("TEOS"), an oxide, or a nitride. The insulating layer 22 may be disposed by any suitable technique known to the art, preferably deposition. The insulating layer 22 in the particular embodiment of FIGS. 4 and 5 is preferably a layer of undoped TEOS oxide. TEOS is preferred because of its relatively good conformal and electrical characteristics. Similarly, the preferred thickness of the insulating layer 22 may vary with the height and width of the feature 12 in a manner known to the art. Thicknesses between 500 Å–1,500 Å may be typical for insulating the layer 22 and, preferably, a thickness of approximately 1,000 Å may be used. Note that the drawings of FIGS. 4–5, as well as FIGS. 6 and 9, are not to scale.

Referring again to FIGS. 5 and 6 a flowable insulating layer 24 of a doped oxide is disposed over the insulating layer 22 in a conformal manner as shown in FIG. 5. The dopant 24 must be iso-electronic to silicon, such as germanium, although other dopants may be suitable. "Iso-electronic" in this context means having the same valence characteristics as silicon so that the dopant will not electrically affect the silicon substrate 14. Thus, other iso-electronic dopants such as tin and carbon may perhaps be theoretically useful although not necessarily commercially viable for modem day processes. It is known that Boron and Phosphorous are unsuitable dopants for this purpose because they are not iso-electric with silicon and can result in ionic contamination, causing unwanted cross-doping and $V_f$ (transistor threshold voltage) shifts.

The doped oxide of the layer 24 should also be readily flowable at temperatures consistent with the materials already present on the substrate 14. The temperature at which a glass becomes readily flowable is known as the glass transition temperature ($T_g$). For instance, the layer 24 in the particular embodiment of FIG. 5 is a germanium doped oxide that has a glass transition temperature of approximately 600° C., although the precise glass transition temperature will vary according to the material's composition. It is preferable to choose a doped oxide that has a glass transition temperature high enough to heal ion implantation damage resulting from an LDD ion implant used in the formation of transistor junctions (not shown) but low enough to prevent excessive thermal diffusion of ion implanted dopants in the substrate 14.

Preferably, the oxide of the layer 24 is a TEOS or a LPCVD oxide such as silane oxide ($SiH_4$). These oxides are preferred since they can be readily and controllably mixed with germanium during the deposition process. Mixing can be performed, for instance, by TEOS liquid injection using a standard BPSG chamber. A germanium containing compound can be mixed with the TEOS prior to injection to the chamber to produce germanium concentrations of 0–25%, and preferably 10%, germanium in the resulting mixture. In one embodiment, tetra metroxy germane (TMOG) at a flow rate of 50–100 mg/min is mixed with TEOS at a flow rate of 750–1000 mg/min to produce a mixture having 10% concentration of germanium. Thicknesses between 500 Å–1,500 Å may be typical for the insulating layer 24 and, preferably, a thickness of approximately 1,000Å may be used. Such a layer of 1,000Å can be deposited in approximately 1 minute at a pressure of 100–500 mBars and a temperature of 500° C. depending on the particular gases used. As with the insulating layer 22, optimal thickness will vary with the height and width of the feature 12 in a manner readily apparent to those of ordinary skill in the art having the benefit of this disclosure.

Referring to FIG. 6, the layer 24 of doped oxide is then reflowed so that layer 24 forms prograde wall profiles. Preferably, the layer 24 is reflowed during subsequent ion-implantation annealing steps and using either rapid thermal processes ("RTP") or furnace annealing processes currently known in the art. As apparent from the above discussion, the temperatures used in the annealing process will exceed the glass transition temperature for the particular material comprising layer 24. An RTP process may be sufficient at a temperature of 600°–800° with ambient Nitrogen atmosphere and, depending on the particular embodiment, with a maximum of 20 seconds at 900° C. A furnace anneal process may be sufficient at 500°–700° C. with an ambient Nitrogen atmosphere and, depending on the particular embodiment, with a maximum of 10–20 minutes at 600°–700° C. Recall, however, that the temperature must exceed the glass transition temperature for the particular embodiment.

Turning to FIG. 7, the integrated circuit structure 10 of FIG. 6 resulting from the above processing is then etched. More specifically, the layers 22 and 24 in one particular embodiment are anisotropically etched to create an oxide spacer in the particular embodiment illustrated in FIG. 7. Suitable spacer oxide etches are widely used and known in the art. Because the resulting structure does not have retrograde wall profiles (i.e., has no overhang), the possibility of leaving unwanted stringers from subsequent processing steps is greatly reduced.

Figure 10:
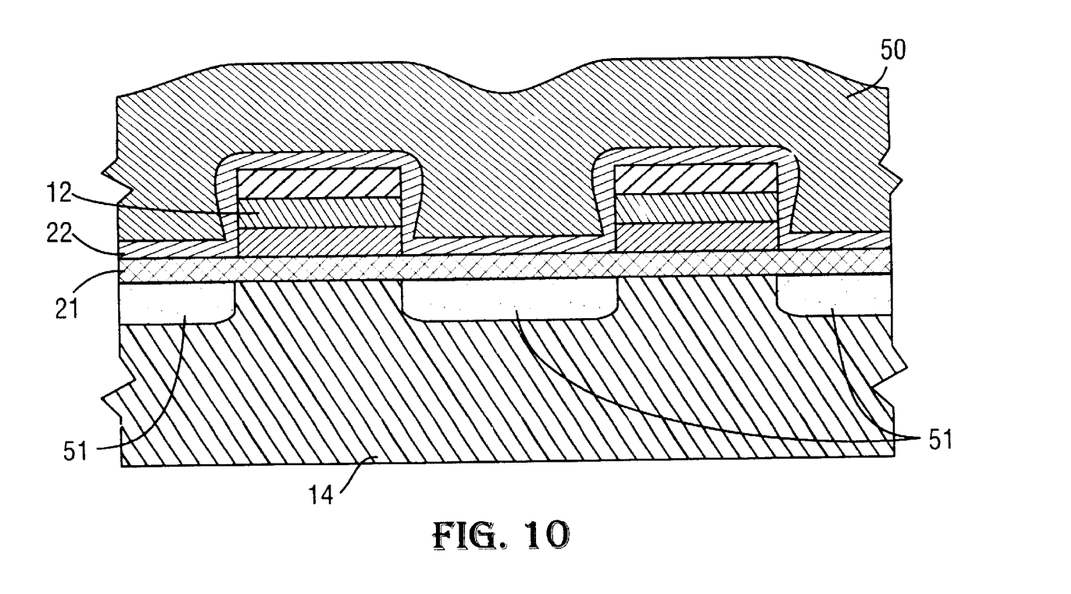
FIG. 10 depicts a cross-section of the integrated circuit structure of the invention in an alternative embodiment.

In an alternative embodiment, an iso-electrically doped glass such as germanium doped oxide can be used in place of the Boron-Phosphorous-Silicate Glass (BPSG), which is commonly used as the interlevel insulator between the transistor gates and overlying metal interconnects in integrated circuits. This embodiment is diagrammed in FIG. 9 and shown in cross section in FIG. 10. As in the preceding embodiment, features 12, such as transistor gates, are present on the surface of substrate 14. These gate structures can and often do have spacer structures, such as those shown in FIG. 7. However, no spacers are shown in FIG. 10 for clarity. After gate definition, diffusion regions 51 are ion implanted into the silicon, substrate 14 using a traditional self-aligned gate process, widely known and used in the art. If spacers were used, another lightly-doped LDD implant would immediately precede gate definition, as one of ordinary skill in the art will recognize. Furthermore, it may be advantageous to first remove portions of the gate oxide 21 and undoped oxide 22 over the substrate 14 to facilitate the introduction of ions into the substrate 14 during ion implantation into the diffusion regions 51.

After ion implantation of the diffusion regions 51, an iso-electrically doped oxide 50, such as germanium doped oxide, is deposited in a manner similar to that described in the preceding embodiment. The oxide 50 can then be subsequently reflowed, as shown in FIG. 10, to provide a suitably planar surface for patterning, and etching of a subsequently deposited conductive layer used as an interconnect (not shown). The use of a germanium doped oxide 50 in place of the traditional BPSG oxide provides two distinct benefits. First, because germanium doped oxide reflows at temperatures lower than BPSG, the reflow process can be used to anneal the junctions at lower temperatures, thus inhibiting unwanted diffusion of the diffused regions 51. Second, because of the iso-electric properties of the germanium doped oxide, unwanted ionic contamination of the gate structures leading to deleterious cross-doping and Vt shifts is reduced.

Figure 11:
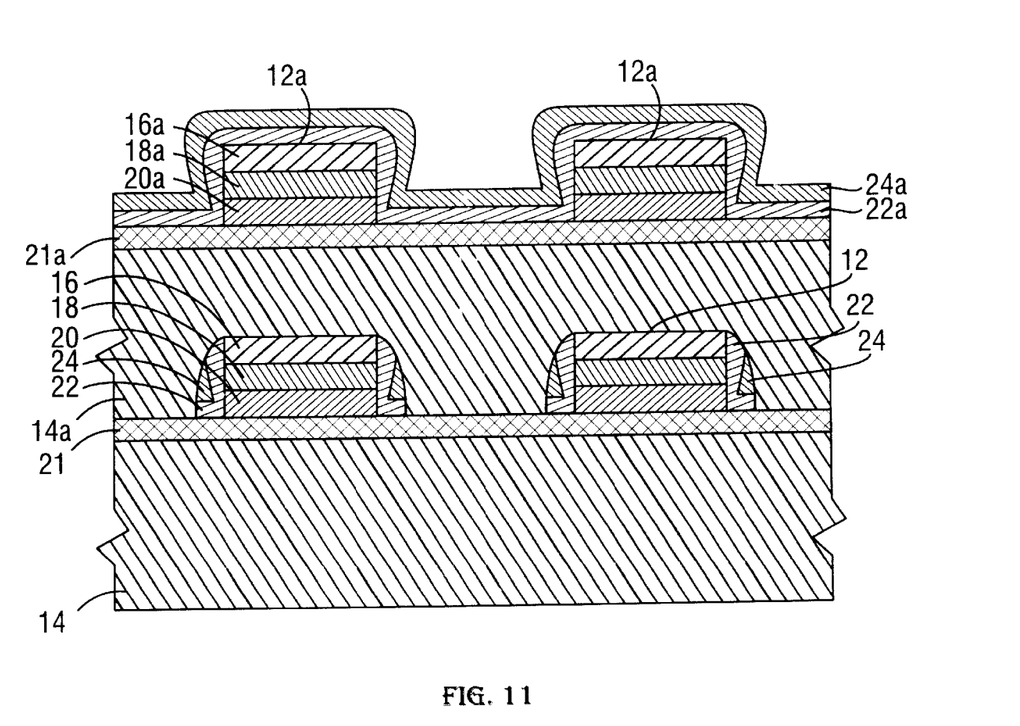
FIG. 11 depicts a cross-section of the integrated circuit structure of the invention in an alternative embodiment.

The particular embodiments disclosed above are illustrative only as the invention may be modified and practiced in different but equivalent manners apparent to those skilled in the art who have the benefit of the teachings herein. Furthermore, no limitations are intended as to the details of construction or design herein shown other than as described in the claims below. For instance, one having ordinary skill in the art will realize that the invention can be used in any process flow having polysilicon deposition for local interconnects. Such an artisan will also realize that the integrated circuit structure disclosed above and claimed below can also be used in numerous combinations with other integrated circuit structures. For instance, as illustrated in FIG. 11, integrated circuit features 12 are gates constructed on gate oxide 21 and substrate 14, substrate 14 being a wafer. Layers 22 and 24 are deposited and etched as described above, and substrate 14a, preferably comprising polysilicon, is deposited over layers 22 and 24. Integrated circuit features 12a are then constructed on oxide layer 21a, which may be either a gate oxide or field oxide depending on the type of structure deposited on substrate 14a. Layer 24a is shown before etching, and subsequent processing as may be desirable and known to the art, may be further employed. Furthermore, substrate 14a could be a insulator.

It is therefore evident that the particular embodiments disclosed above may be altered or modified and all such variations are considered within the scope and spirit of the invention. Accordingly, the protection sought in this application is as set forth in the claims below.

What is claimed is:

1. A method for constructing an integrated circuit structure, comprising:

disposing a layer of doped oxide, the dopant being iso-electronic to silicon;

reflowing the layer of doped oxide; and etching the insulating layer and the doped oxide with a spacer etch.

such that said doped oxide is removed from an upper surface of said integrated circuit structure and integrated circuit structure has a prograde sidewall profile.

2. The method of claim 1, further comprising constructing an integrated circuit feature on a substrate before disposing the layer of doped oxide.

3. The method of claim 2, wherein the construction of the integrated circuit feature comprises constructing at least one of a gate, a metal line, an interconnect, a capacitor, a node, and a lead.

4. The method of claim 2, wherein the construction of the integrated circuit feature comprises:

disposing at least one conductive layer over the substrate; and etching the conductive layer to a predetermined pattern.

5. The method of claim 1, wherein disposing the doped oxide comprises disposing the doped oxide over a substrate.

6. The method of claim 1, wherein disposing doped oxide comprises disposing the doped oxide over a substrate comprising at least one of a wafer and a previously disposed insulator.

7. The method of claim 2, further comprising disposing an insulating layer over the integrated circuit feature and the substrate in a substantially conformal manner.

8. The method of claim 7, wherein disposing the insulating layer comprises disposing a layer of at least one of TEOS, an oxide, a nitride, or a polyimide.

9. The method of claim 7, wherein the insulating layer is disposed by deposition.

10. The method of claim 1 wherein the dopant comprises germanium.

11. The method of claim 1 wherein the doped oxide comprises at least one of TEOS and a LPCVD oxide.

12. The method of claim 11, wherein the oxide is silane oxide.

13. The method of claim 1 wherein the doped oxide is disposed by low pressure, chemical vapor deposition.

14. The method of claim 13, wherein the dopant is mixed with the oxide during the deposition process.

15. The method of claim 1 wherein the doped oxide reflows during annealing.

16. The method of claim 15 wherein the doped oxide is annealed by rapid thermal processing.

17. The method of claim 15, wherein the doped oxide is annealed by furnace processing.

18. The method of claim 1 further comprising etching the doped oxide.

19. The method of claim 18, wherein the doped oxide layer is etched with a spacer etch.

20. A method for constructing an integrated circuit structure, comprising:

disposing a layer of doped oxide, the dopant being isoelectronic to silicon reflowing the layer of doped oxide; and etching the reflowed oxide with a spacer etch;

such that said doped oxide is removed form an upper surface of said integrated circuit structure and integrated circuit structure has a prograde sidewall profile.

21. The method of claim 20, further comprising constructing an integrated circuit feature on a substrate before disposing the oxide layer.

22. The method of claim 21, wherein constructing the integrated circuit feature comprises constructing at least one of a gate, a metal line, an interconnect, a capacitor, a node, and a lead.

23. The method of claim 21, wherein the construction of the integrated circuit feature comprises:

disposing at least one conductive layer over the substrate; and etching the conductive layer to a predetermined pattern.

24. The method of claim 21, further comprising disposing an insulating layer over the integrated circuit feature and the substrate in a substantially conformal manner.

25. The method of claim 24, wherein disposing the insulating layer comprises disposing at least one of TEOS, an oxide, a nitride, or a polyimide.

26. The method of claim 24, wherein the insulating layer is disposed by deposition.

27. The method of claim 20, wherein the dopant comprises germanium.

28. The method of claim 20, wherein the doped oxide comprises at least one of TEOS and a LPCVD oxide.

29. The method of claim 28, wherein the oxide is silane oxide.

30. The method of claim 20, wherein the doped oxide is disposed by low pressure, chemical vapor deposition.

31. The method of claim 30, wherein the dopant is mixed with the oxide during the deposition process.

32. The method of claim 20, wherein the doped oxide reflows during annealing.

33. The method of claim 32 wherein the doped oxide is annealed by rapid thermal processing.

34. The method of claim 32, wherein the doped oxide is annealed by furnace annealing.

35. A method for constructing an integrated circuit structure, comprising:

constructing an integrated circuit feature on a substrate, the integrated circuit feature comprising at least one of a gate, a metal line, an interconnect, a capacitor, a node, and a lead and the substrate comprising at least one of a wafer and a previously disposed insulator from a previously fabricated integrated circuit structure;

depositing an insulating layer over the integrated circuit feature and the substrate in a substantially conformal manner, the insulating layer comprising at least one of TEOS, an oxide, a nitride, or a polyimide;

disposing a layer of germanium doped oxide over the integrated circuit feature in a substantially conformal manner, the doped oxide comprises at least one of TEOS and a LPCVD oxide;

reflowing the layer of doped oxide; and etching the insulating layer and the doped oxide layer with a spacer etch;

such that said doped oxide is removed from an upper surface of said integrated circuit structure and integrated circuit structure has a prograde sidewall profile.

36. The method of claim 35, wherein the doped oxide is disposed by low pressure, chemical vapor deposition.

37. The method of claim 36, wherein the dopant is mixed with the doped oxide during the deposition process.

38. The method of claim 35, wherein the doped oxide reflows during at least one of rapid thermal processing and furnace annealing.

* * * * *

UNITED STATES PATENT AND TRADEMARK OFFICE
CERTIFICATE OF CORRECTION

PATENT NO. : 6,274,479 B1
APPLICATION NO. : 09/137736
DATED : August 14, 2001
INVENTOR(S) : Anand Srinivasan It is certified that error appears in the above-identified patent and that said Letters Patent is hereby corrected as shown below:

Claim 20, column 7, line 30, should read --from-- instead of "form".

Signed and Sealed this

Nineteenth Day of December, 2006

JON W. DUDAS
*Director of the United States Patent and Trademark Office*